US009294091B1

(12) United States Patent
Kireev et al.

(10) Patent No.: US 9,294,091 B1
(45) Date of Patent: Mar. 22, 2016

(54) METHOD AND APPARATUS FOR PROVIDING A DIFFERENTIAL OUTPUT DRIVER WITH A CROSS-COUPLED CELL

(71) Applicant: Xilinx, Inc., San Jose, CA (US)

(72) Inventors: Vassili Kireev, San Jose, CA (US); Hsung Jai Im, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/056,895

(22) Filed: Oct. 17, 2013

(51) Int. Cl.
  *H03K 3/03* (2006.01)
  *H03K 19/003* (2006.01)
  *H03K 3/015* (2006.01)

(52) U.S. Cl.
  CPC .......... *H03K 19/00315* (2013.01); *H03K 3/015* (2013.01); *H03K 3/0315* (2013.01)

(58) Field of Classification Search
  CPC .. H03K 3/0315; H03K 3/0322; H03L 7/0995; H04L 25/0278
  See application file for complete search history.

(56) References Cited

U.S. PATENT DOCUMENTS

| | | | |
|---|---|---|---|
| 6,411,126 B1 | 6/2002 | Tinsley et al. | |
| 6,859,064 B1 * | 2/2005 | Maangat | H04L 25/0278 326/127 |
| 7,132,847 B1 | 11/2006 | Wong et al. | |
| 7,176,737 B2 * | 2/2007 | Baker | H03K 5/133 327/158 |
| 7,557,615 B1 | 7/2009 | Tran et al. | |
| 7,965,120 B2 * | 6/2011 | Lewison | H03K 5/133 327/261 |
| 8,207,763 B1 * | 6/2012 | In | H03K 3/0315 327/117 |
| 8,570,109 B2 * | 10/2013 | Song | H03K 3/0322 327/233 |
| 2009/0015319 A1 * | 1/2009 | Tzeng | H03L 7/0995 327/537 |

FOREIGN PATENT DOCUMENTS

EP  1 744 458 A1  1/2007

OTHER PUBLICATIONS

Galal, S. et al., "10-Gb/s Limiting Amplifier and Laser/Modulator Driver in 0.18-um CMOS Technology", IEEE Journal of Solid—State Circuits, vol. 38, No. 12, Dec. 2003, pp. 2138-2146.
Kim, J. et al., "Circuit Techniques for a 40Gb/s Transmitter in 0.13um CMOS", ISSCC 2005, Session 8, Circuits for High-Speed Links and Clock-Generators, 8.1, pp. 150-151, and 589.
Savoj, J. et al., "A Wide Common-Mode Fully-Adaptive Multi-Standard 12.5Gb/s Backplane Transceiver in 28nm CMOS", 2012 Symposium on VLSI Circuits Digest of Technical Papers, pp. 104-105.

* cited by examiner

*Primary Examiner* — Jason M Crawford
*Assistant Examiner* — Kurtis R Bahr
(74) *Attorney, Agent, or Firm* — Kin-Wah Tong; Diana J. Rea (57) ABSTRACT

An integrated circuit and method for providing a differential transmission line driver are disclosed. One embodiment of the differential transmission line driver comprises a current mode logic (CML) stage, and a cross-coupled n-channel enhancement type metal-oxide semiconductor field-effect transistor (NMOS) stage, wherein the cross-coupled NMOS stage provides a feedback current to the CML stage, where each output voltage of the differential transmission line driver is characterized by symmetrical rising and falling edges.

9 Claims, 5 Drawing Sheets

METHOD AND APPARATUS FOR PROVIDING A DIFFERENTIAL OUTPUT DRIVER WITH A CROSS-COUPLED CELL

FIELD OF THE INVENTION

The present disclosure relates generally to integrated circuits and more particularly, to differential transmission line drivers for high speed data transmission lines.

BACKGROUND OF THE INVENTION

In parallel transmission, multiple data differential pairs carry several signals concurrently on several single-ended channels. A clock signal for synchronizing the data at a receiver is also carried on a channel. In serial communications, multiple single-ended signals are serialized by a serializer into a single differential pair with a data rate equal to the summation of the data rates of the single-ended channels that are combined. The serialized data is then driven by a driver logic, or simply driver.

A current mode logic (CML) differential output driver is a type of driver used for high speed transmission lines. The transmission is terminated via a resistor with a resistance that matches the resistance of the transmission line. A CML driver has close to a constant power level over a wide frequency range. Consequently, unlike those of other drivers, the power consumption associated with CML is not frequency dependent. The constant power level makes CML drivers convenient for bandwidth extension. In addition, a CML has a reduced voltage swing. The reduced voltage swing enables the CML to have a faster voltage transition as compared to transitions of other logics.

In order to transmit the data on the high speed data transmission line, the power level of a pre-driver that comprises the serializer may be transformed to the power level of the driver. One approach is to raise the input common mode of the pre-driver to a suitable level for the CML driver. However, raising the signal level of the serializer to the signal level of the CML has several undesirable effects. For example, raising the signal level of the serializer raises the power consumption of the pre-driver, increases output common mode ripples, and increases the spikes on differential signals for skewed inverters.

SUMMARY OF THE INVENTION

The present disclosure provides an integrated circuit and a method for providing a differential transmission line driver. One example of the differential transmission line driver comprises a current mode logic (CML) stage, and a cross-coupled n-channel enhancement type metal-oxide semiconductor field-effect transistor (NMOS) stage, wherein the cross-coupled NMOS stage provides a feedback current to the CML stage, where each output voltage of the differential transmission line driver is characterized by symmetrical rising and falling edges.

In various embodiments of the differential transmission line driver, the cross-coupled NMOS stage comprises: a first NMOS transistor of the cross-coupled NMOS stage and a second NMOS transistor of the cross-coupled NMOS stage, wherein a gate terminal of the first NMOS transistor of the cross-coupled NMOS stage is connected to a drain terminal of the second NMOS transistor of the cross-coupled NMOS stage, wherein a gate terminal of the second NMOS transistor of the cross-coupled NMOS stage is connected to a drain terminal of the first NMOS transistor of the cross-coupled NMOS stage, the CML stage comprises: a first load resistor, a second load resistor, a first NMOS transistor of the CML stage, a second NMOS transistor of the CML stage, a third NMOS transistor of the CML stage, wherein a first end of the first load resistor is connected to a supply voltage, wherein a second end of the first load resistor is connected to a drain terminal of the first NMOS transistor of the CML stage, wherein a source terminal of the first NMOS transistor of the CML stage is connected to a drain terminal of the third NMOS transistor of the CML stage, wherein a gate terminal of the first NMOS transistor of the CML stage is connected to a first input current, wherein a gate terminal of the third NMOS transistor of the CML stage is connected to a DC bias, wherein a source terminal of the third NMOS transistor of the CML stage is connected to a bias current source, wherein the bias current source is connected to a ground terminal, wherein a first end of the second load resistor is connected to a supply voltage, wherein a second end of the second load resistor is connected to a drain terminal of the second NMOS transistor of the CML stage, wherein a source terminal of the second NMOS transistor of the CML stage is connected to the drain terminal of the third NMOS transistor of the CML stage, the drain terminal of the first NMOS transistor of the CML stage is connected to the drain terminal of the first NMOS transistor of the cross-coupled NMOS stage, the drain terminal of the second NMOS transistor of the CML stage is connected to the drain terminal of the second NMOS transistor of the cross-coupled NMOS stage, the source terminal of the first NMOS transistor of the CML stage is connected to the source terminal of the first NMOS transistor of the cross-coupled NMOS stage, and the source terminal of the second NMOS transistor of the CML stage is connected to the source terminal of the second NMOS transistor of the cross-coupled NMOS stage; the first load resistor and the second load resistor are of equal value; each of the first load resistor and the second load resistor is equal to 50Ω; the first NMOS transistor of the CML stage and the second NMOS transistor of the CML stage have a same characteristic; the first NMOS transistor of the cross-coupled NMOS stage and the second NMOS transistor of the cross-coupled NMOS stage have a same characteristic; the first NMOS transistor of the CML stage, the second NMOS transistor of the CML stage, the first NMOS transistor of the cross-coupled NMOS stage, and the second NMOS transistor of the cross-coupled NMOS stage have a same characteristic; the cross-coupled NMOS stage comprises: a first NMOS transistor of the cross-coupled NMOS stage, a second NMOS transistor of the cross-coupled NMOS stage, and a third NMOS transistor of the cross-coupled NMOS stage, wherein a gate terminal of the first NMOS transistor of the cross-coupled NMOS stage is connected to a drain terminal of the second NMOS transistor of the cross-coupled NMOS stage, wherein a gate terminal of the second NMOS transistor of the cross-coupled NMOS stage is connected to a drain terminal of the first NMOS transistor of the cross-coupled NMOS stage, wherein a source terminal of the first NMOS transistor of the cross-coupled NMOS stage is connected to a drain terminal of the third NMOS transistor of the cross-coupled NMOS stage, wherein a source terminal of the second NMOS transistor of the cross-coupled NMOS stage is connected to the drain terminal of the third NMOS transistor of the cross-coupled NMOS stage, wherein a gate terminal of the third NMOS transistor of the cross-coupled NMOS stage is connected to a DC bias, wherein a source terminal of the third NMOS transistor of the cross-coupled NMOS stage is connected to a bias current source, the CML stage comprises: a first load resistor, a second load resistor, a first NMOS transistor of the CML stage, a second NMOS transistor of the CML stage, a third NMOS transistor of the CML stage, wherein a first end of the first load resistor is connected to a supply voltage, wherein a second end of the first load resistor is connected to a drain terminal of the first NMOS transistor of the CML stage, wherein a source terminal of the first NMOS transistor of the CML stage is connected to a drain terminal of the third NMOS transistor of the CML stage, wherein a gate terminal of the first NMOS transistor of the CML stage is connected to a first input current, wherein a gate terminal of the third NMOS transistor of the CML stage is connected to a DC bias, wherein a source terminal of the third NMOS transistor of the CML stage is connected to the bias current source, wherein the bias current source is connected to a ground terminal, wherein a first end of the second load resistor is connected to the supply voltage, wherein a second end of the second load resistor is connected to a drain terminal of the second NMOS transistor of the CML stage, wherein a source terminal of the second NMOS transistor of the CML stage is connected to the drain terminal of the third NMOS transistor of the CML stage, the drain terminal of the first NMOS transistor of the CML stage is connected to the drain terminal of the first NMOS transistor of the cross-coupled NMOS stage, and the drain terminal of the second NMOS transistor of the CML stage is connected to the drain terminal of the second NMOS transistor of the cross-coupled NMOS stage, the first load resistor and the second load resistor are of equal value, each of the first load resistor and the second load resistor is equal to 50Ω; the first NMOS transistor of the CML stage and the second NMOS transistor of the CML stage have a same characteristic; the first NMOS transistor of the cross-coupled NMOS stage and the second NMOS transistor of the cross-coupled NMOS stage have a same characteristic; the first NMOS transistor of the CML stage, the second NMOS transistor of the CML stage, the first NMOS transistor of the cross-coupled NMOS stage, and the second NMOS transistor of the cross-coupled NMOS stage have a same characteristic; a ratio of a current flowing through the CML stage and a current flowing through the cross-coupled NMOS stage is controlled via the DC bias; the cross-coupled NMOS stage comprises: a first NMOS transistor of the cross-coupled NMOS stage, a second NMOS transistor of the cross-coupled NMOS stage, and a third NMOS transistor of the cross-coupled NMOS stage, wherein a gate terminal of the first NMOS transistor of the cross-coupled NMOS stage is connected to a drain terminal of the second NMOS transistor of the cross-coupled NMOS stage, wherein a gate terminal of the second NMOS transistor of the cross-coupled NMOS stage is connected to a drain terminal of the first NMOS transistor of the cross-coupled NMOS stage, wherein a source terminal of the first NMOS transistor of the cross-coupled NMOS stage is connected to a drain terminal of the third NMOS transistor of the cross-coupled NMOS stage, wherein a source terminal of the second NMOS transistor of the cross-coupled NMOS stage is connected to the drain terminal of the third NMOS transistor of the cross-coupled NMOS stage, wherein a gate terminal of the third NMOS transistor of the cross-coupled NMOS stage is connected to a DC bias, wherein a source terminal of the third NMOS transistor of the cross-coupled NMOS stage is connected to a bias current source, the CML stage comprises: a first load resistor, a second load resistor, a first NMOS transistor of the CML stage, a second NMOS transistor of the CML stage, a third NMOS transistor of the CML stage, wherein a first end of the first load resistor is connected to a supply voltage, wherein a second end of the first load resistor is connected to a drain terminal of the first NMOS transistor of the CML stage, wherein a source terminal of the first NMOS transistor of the CML stage is connected to a drain terminal of the third NMOS transistor of the CML stage, wherein a gate terminal of the first NMOS transistor of the CML stage is connected to a first input current, wherein a gate terminal of the third NMOS transistor of the CML stage is connected to a DC bias, wherein a source terminal of the third NMOS transistor of the CML stage is connected to the bias current source, wherein the bias current source is connected to a ground terminal, wherein a first end of the second load resistor is connected to the supply voltage, wherein a second end of the second load resistor is connected to a drain terminal of the second NMOS transistor of the CML stage, wherein a source terminal of the second NMOS transistor of the CML stage is connected to the drain terminal of the third NMOS transistor of the CML stage, the drain terminal of the first NMOS transistor of the CML stage is connected to the drain terminal of the first NMOS transistor of the cross-coupled NMOS stage, the drain terminal of the second NMOS transistor of the CML stage is connected to the drain terminal of the second NMOS transistor of the cross-coupled NMOS stage, the source terminal of the first NMOS transistor of the CML stage is connected to a pass gate, and the source terminal of the first NMOS transistor of the cross-coupled NMOS stage is connected to the pass gate; the first load resistor and the second load resistor are of equal value; each of the first load resistor and the second load resistor is equal to 50Ω; the first NMOS transistor of the CML stage and the second NMOS transistor of the CML stage have a same characteristic; and the first NMOS transistor of the cross-coupled NMOS stage and the second NMOS transistor of the cross-coupled NMOS stage have a same characteristic.

According to another example, a method of providing a differential transmission line driver is provided. The method comprises providing a feedback current to a current mode logic of the differential transmission line drive via a cross-coupled n-channel enhancement type metal-oxide semiconductor field-effect transistor (NMOS) stage, wherein the feedback current is provided by: connecting a drain terminal of a first NMOS transistor of the cross-coupled NMOS stage to a first output terminal of the current mode logic of the differential transmission line driver, and connecting a drain terminal of a second NMOS transistor of the cross-coupled NMOS stage to a second output terminal of the current mode logic of the differential transmission line driver, wherein a first input current and a second input current are provided to the current mode logic of the differential transmission line driver, wherein the first input current and the second input current have equal values, and the first input current and the second input current are one hundred eighty degrees out of phase.

BRIEF DESCRIPTION OF THE DRAWINGS

Accompanying drawings show exemplary embodiments in accordance with one or more aspects of the disclosure; however, the accompanying drawings should not be taken to limit the disclosure to the embodiments shown, but are for explanation and understanding only.

To facilitate understanding, identical reference numerals have been used, where possible, to designate identical elements that are common to the figures.

DETAILED DESCRIPTION OF THE DRAWINGS

The present disclosure provides a differential transmission line driver that comprises a cross-coupled cell. In order to use the same transmitter for both low and high data rates, transmission systems may need to implement a method for controlling a slew rate of a driver. The slew rate refers to a maximum rate of change of the output. The control of the slew rate of a CML driver is implemented on a pre-driver. Implementing the control of the slew rate in the pre-driver allows the driver to be designed to be insensitive to an input slew rate. The performance requirements of the CML driver over variations of a Process Voltage Temperature (PVT) may then be met. However, this approach makes the driver dependent on a type of the pre-driver that is implemented. In addition, the slew rate adjustments may require additional loading and complexity in the circuitry of the pre-driver.

The present disclosure provides a differential transmission line driver that is obtained by adding a cross-coupled n-channel enhancement type metal-oxide semiconductor field-effect transistor (NMOS) cell to a CML driver. The NMOS stage provides a feedback current to the CML driver such that the differential output voltage of the CML stage is more symmetrical. The topology of the differential transmission line driver of the present disclosure is independent of the type of the pre-driver because the cross-coupled cell of the present disclosure is realized on the driver. As such, the pre-driver may be a complementary metal-oxide semiconductor (CMOS) pre-driver, a CML pre-driver, or any other standard pre-driver. The differential transmission line driver of the present disclosure enables direct control of the slew rate of the driver.

Figure 1:
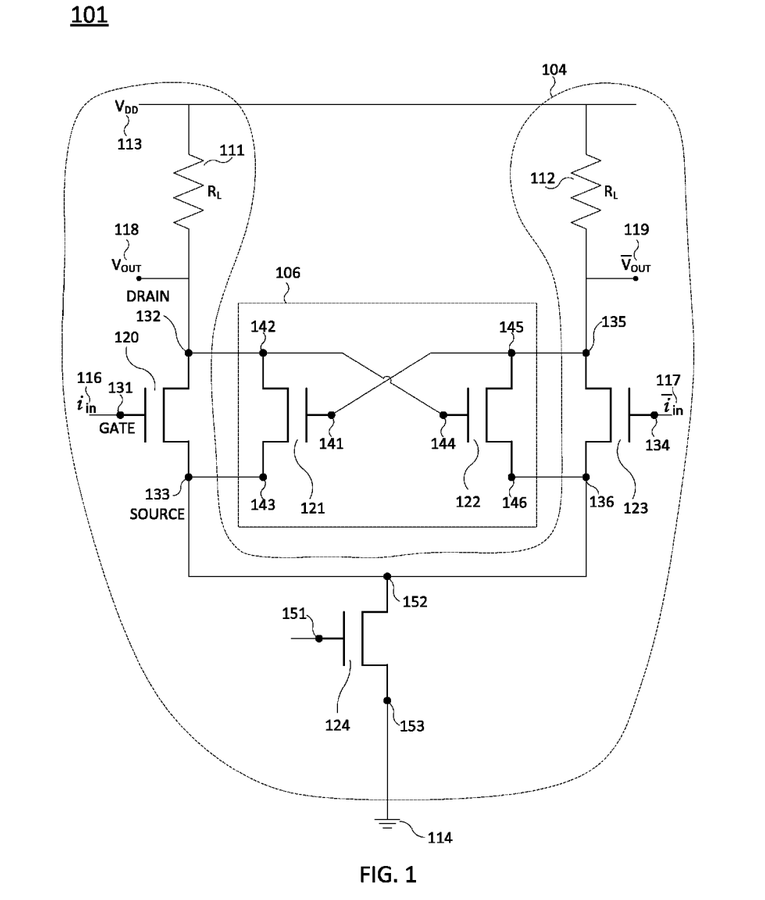
FIG. 1 illustrates a differential transmission line driver of the present disclosure.

FIG. 1 illustrates a differential transmission line driver 101 of the present disclosure. The differential transmission line driver 101 (or simply driver 101) comprises a CML stage 104 and a cross-coupled NMOS stage 106.

The CML stage 104 comprises: load resistors 111 and 112 of equal value (e.g., $R_L=50\Omega$); matching (broadly having the same characteristics) NMOS transistors 120 and 123, an NMOS transistor 124; current sources of equal magnitude and opposite polarity 116 and 117; and a supply voltage ($V_{DD}$) 113. The transistor 124 acts as controllable current source with a DC bias applied to the gate 151. One end of the resistor 111 is connected to the supply voltage 113. The other end of the resistor 111 is connected to a drain terminal 132 of the transistor 120. A gate terminal 131 of the transistor 120 is connected to the current source 116. A source terminal 133 of the transistor 120 is connected to a drain terminal 152 of the transistor 124. The source terminal of the transistor 124 is connected to a ground terminal 114. Similarly, one end of the resistor 112 is connected to the supply voltage 113. The other end of the resistor 112 is connected to a drain terminal 135 of the transistor 123. A gate terminal 134 of the transistor 123 is connected to the current source 117. A source terminal 136 of the transistor 123 is connected to the drain terminal 152 of the transistor 124.

The cross-coupled NMOS stage 106 comprises: matching (broadly having the same characteristics) NMOS transistors 121 and 122. A gate terminal 141 of the transistor 121 is connected to a drain terminal 145 of the transistor 122, and a gate terminal 144 of the transistor 122 is connected to a drain terminal 142 of the transistor 121, thereby forming the cross-coupled NMOS stage. The drain terminal 132 of the transistor 120 of the CML stage 104 is connected to the drain terminal 142 of the transistor 121 of the cross-coupled NMOS stage 106. The source terminal 133 of the transistor 120 is connected to the source terminal 143 of the transistor 121. The drain terminal 135 of the transistor 123 of the CML stage 104 is connected to the drain terminal 145 of the transistor 122 of the cross-coupled NMOS stage 106. The source terminal 136 of the transistor 123 is connected to the source terminal 146 of the transistor 122.

When current is flowing through the cross-coupled NMOS stage, the transistors 121 and 122 form a regenerative feedback circuit. The rising and falling edges of the driver voltage outputs 118 and 119 become more symmetrical. The symmetry reduces the common mode ripples and differential spikes. Hence, as compared to a standard CML driver that does not have the cross-coupled NMOS stage, the driver of FIG. 1 operates with a lower input common mode. For the driver of FIG. 1, a large increase of a pre-driver common mode is not required for operation. For instance, the symmetry of the rising and falling edges of the driver voltage outputs 118 and 119 reduces the common mode ripples and differential spikes by about 50-75%, while the pre-driver load is reduced by about 30-50%.

In one example, the differential transmission line driver of the present disclosure is realized via a topology that enables control of a partitioning of a tail current to: a first portion that flows through a branch that comprises the CML, and a second portion that flows through a branch that comprises the cross-coupled NMOS cell. The ratio of the second portion to the first portion may then be used to control a slew rate of the differential transmission line driver of the present disclosure. The ability to control the slew rate enables a same transmitter to be used for both low and high data rates. The realization of the differential transmission line driver with the ability to control the partitioning of the tail current provides a built-in circuitry for adjusting the slew rate of the differential transmission line driver, without an additional loading. The built-in circuitry for adjusting the slew rate may be realized by biasing the branch that comprises the CML and the branch that comprises the cross-coupled NMOS cell, independently.

Figure 2:
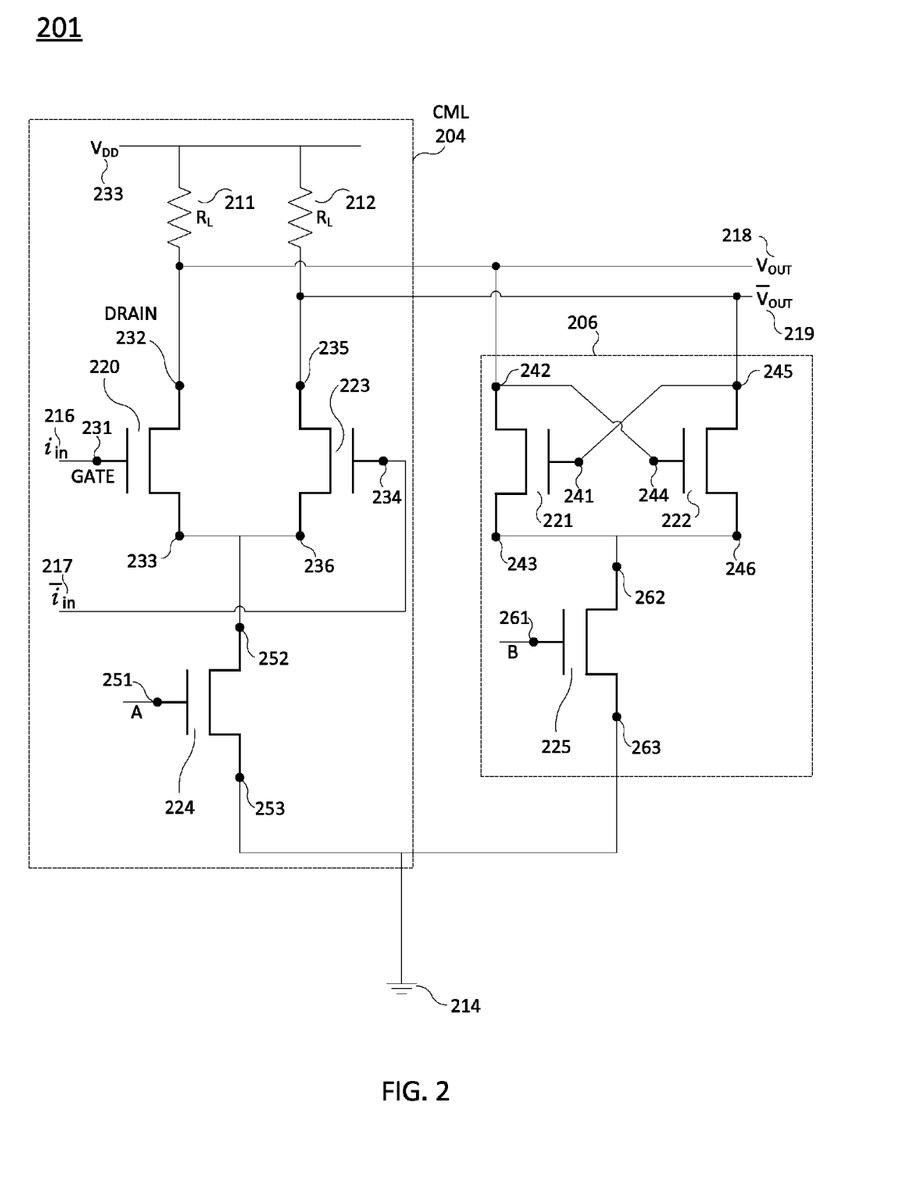
FIG. 2 illustrates a differential transmission line driver of the present disclosure that comprises a circuitry for controlling a slew rate.

FIG. 2 illustrates a differential transmission line driver 201 of the present disclosure that comprises a circuitry for controlling the slew rate. The differential transmission line driver 201 (or simply driver 201) comprises a CML stage 204 and a cross-coupled NMOS stage 206.

The CML stage 204 comprises: load resistors 211 and 212 of equal value ($R_L$); matching NMOS transistors 220 and 223, an NMOS transistor 224; current sources of equal magnitude and opposite polarity 216 and 217; and a supply voltage 233 ($V_{DD}$). One end of the resistor 211 is connected to the supply voltage 233 ($V_{DD}$). The other end of the resistor 211 is connected to a drain terminal 232 of the transistor 220. A gate terminal 231 of the transistor 220 is connected to the current source 216. A source terminal 233 of the transistor 220 is connected to a drain terminal 252 of the transistor 224. The source terminal of the transistor 224 is connected to a ground terminal 214. The transistor 224 acts as controllable current source with a DC bias applied to the gate 251. Similarly, one end of the resistor 212 is connected to the supply voltage 233. The other end of the resistor 212 is connected to a drain terminal 235 of the transistor 223. A gate terminal 234 of the transistor 223 is connected to the current source 217. A source terminal 236 of the transistor 223 is connected to the drain terminal 252 of the transistor 224.

The cross-coupled NMOS stage 206 comprises: matching NMOS transistors 221 and 222. A gate terminal 241 of the transistor 221 is connected to a drain terminal 245 of the transistor 222, and a gate terminal 244 of the transistor 222 is connected to a drain terminal 242 of the transistor 221, thereby forming the cross-coupled NMOS stage. The drain terminal 232 of the transistor 220 is connected to the drain terminal 242 of the transistor 221 of the cross-coupled NMOS stage 206. The source terminal 243 of the transistor 221 is connected to the drain terminal 262 of the transistor 225. The transistor 225 acts as controllable current source with a DC bias applied to the gate 261. The source terminal 246 of the transistor 222 is connected to the drain terminal 262 of the transistor 225. The source terminal 263 of the transistor 225 is connected to a ground terminal 214.

The drain terminal 242 of the transistor 221 is connected to a driver output 218. The drain terminal 245 of the transistor 222 is connected to a driver output 219. The voltage outputs 218 and 219 are driven 180 degrees out of phase. When current is flowing through the cross-coupled NMOS stage, the transistors 221 and 222 form a regenerative feedback circuit, thereby making the rising and falling edges of the voltage outputs 218 and 219 more symmetrical. A receiver at the destination recovers the differential signal as the difference between the voltage outputs 218 and 219. Hence, the symmetry reduces the differential spikes and the common mode ripples. For clarity, the partitioning may be described in terms of a ratio. For example, a ratio of B:A.

Figure 3:
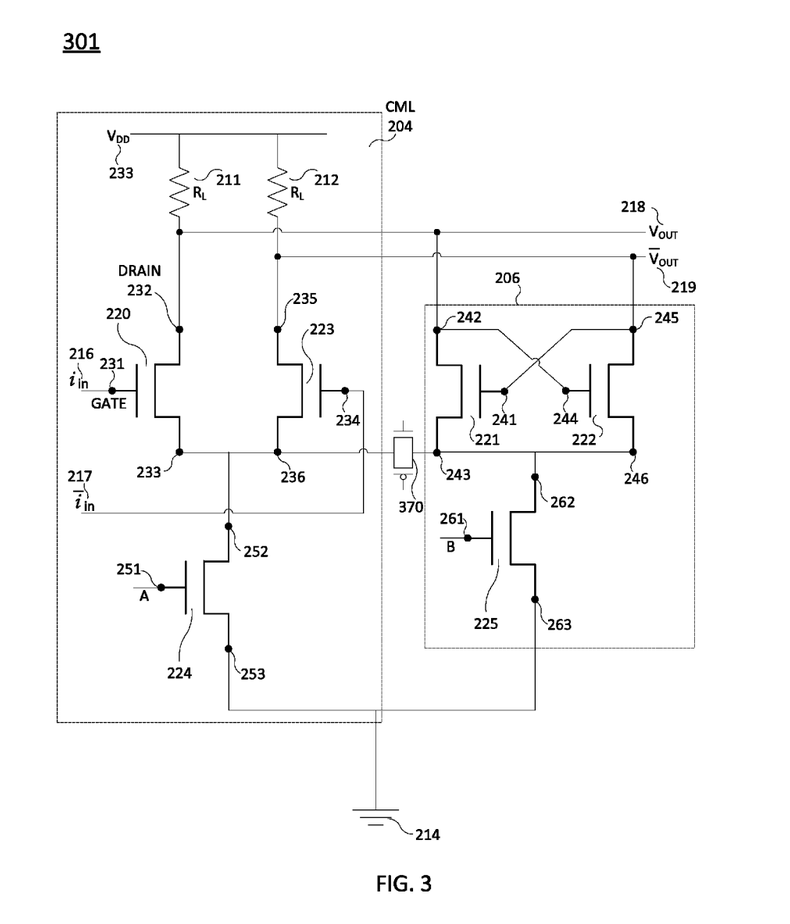
FIG. 3 illustrates a differential transmission line driver of the present disclosure that is realized via a pass gate.

FIG. 3 illustrates a differential transmission line driver 301 of the present disclosure that is realized via a pass gate. The pass gate 370 enables the driver of FIG. 3 to revert to either the configuration as illustrated in FIG. 1 or the configuration as illustrates in FIG. 2. In order to obtain the differential transmission line driver of FIG. 3, the source terminals of the CML stage (tail nodes of transistors 220 and 223) are connected to the pass gate 370. Similarly, the source terminals of the cross-coupled NMOS stage (tail nodes of transistors 221 and 222) are connected to the pass gate 370. As such, the operation of driver 301 is identical to that of the driver 201 with the exception of the pass gate 370.

It should be noted that although various realizations of the differential transmission line driver of the present disclosure are illustrated in FIGS. 1-3, the above realizations are only illustrative. The cross-coupled NMOS stage may be added to a CML driver via any realization. Moreover, the driver of the present disclosure may comprise an active load. For example, the load resistor, $R_L$, may be replaced by an active circuit. In another example, the driver of the present disclosure may comprise feedback circuit. For example, a feedback circuit may be implemented for the transistors that serve as latches.

Figure 4:
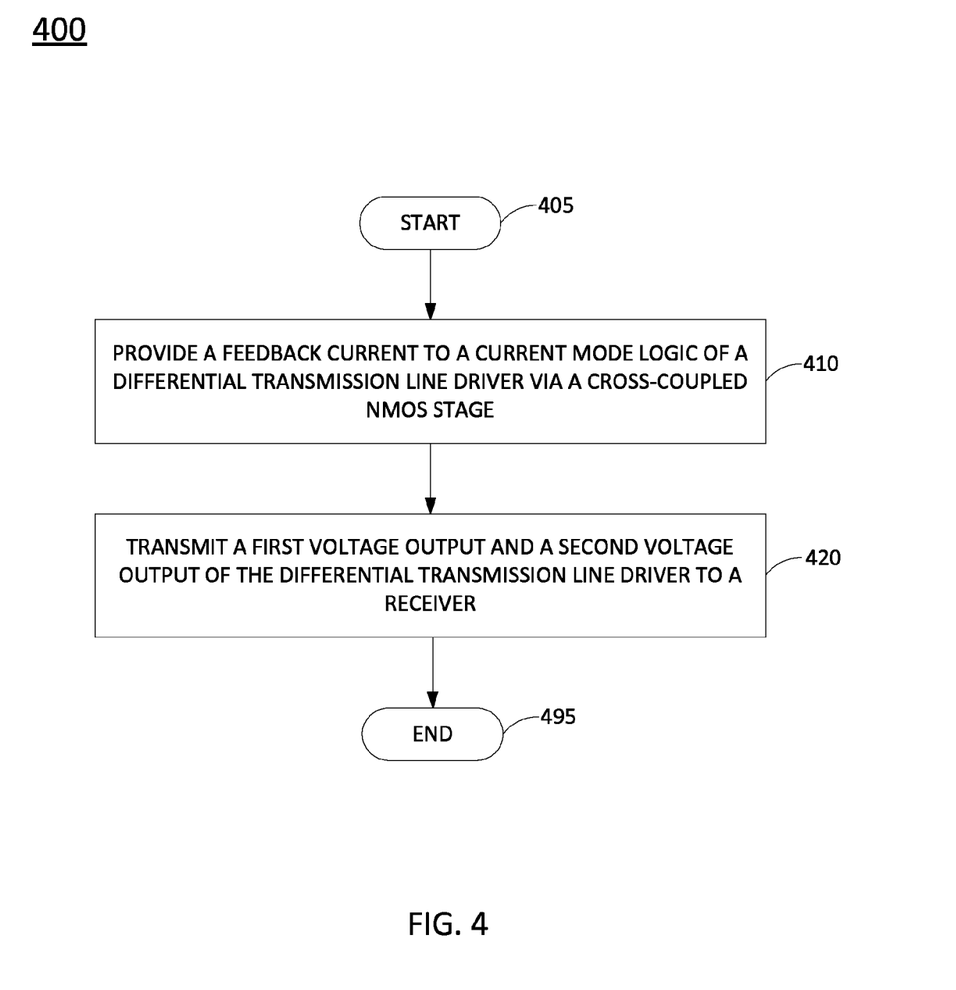
FIG. 4 illustrates a flowchart of a method for providing a differential transmission line driver.

FIG. 4 illustrates a flowchart of a method 400 for providing a differential transmission line driver. In one embodiment, method 400 may be implemented in an integrated circuit (IC) chip. Method 400 starts in step 405 and proceeds to step 410.

In step 410, the method 400 provides a feedback current to a current mode logic of the differential transmission line driver via a cross-coupled NMOS stage. In one example, the feedback current is provided by connecting a drain terminal of a first NMOS transistor of the cross-coupled NMOS stage to a first voltage output terminal of the current mode logic of the differential transmission line driver, and connecting a drain terminal of a second NMOS transistor of the cross-coupled NMOS stage to a second voltage output terminal of the current mode logic of the differential transmission line driver. A first input current and a second input current of equal value are provided to the current mode logic of the differential transmission line driver. The first input current and the second input current are one hundred eighty degrees out of phase.

In step 420, the method 400 transmits the first voltage output and the second voltage output. A receiver may then recover the transmitted signal as a difference between the first and the second voltage outputs. The method then proceeds to step 495 to end the process.

It should be noted that although not specifically specified, one or more steps or operations of method 400 may include a storing, displaying and/or outputting step as required for a particular application. In other words, any data, records, fields, and/or intermediate results discussed in the method can be stored, displayed and/or outputted to another device as required for a particular application.

Figure 5:
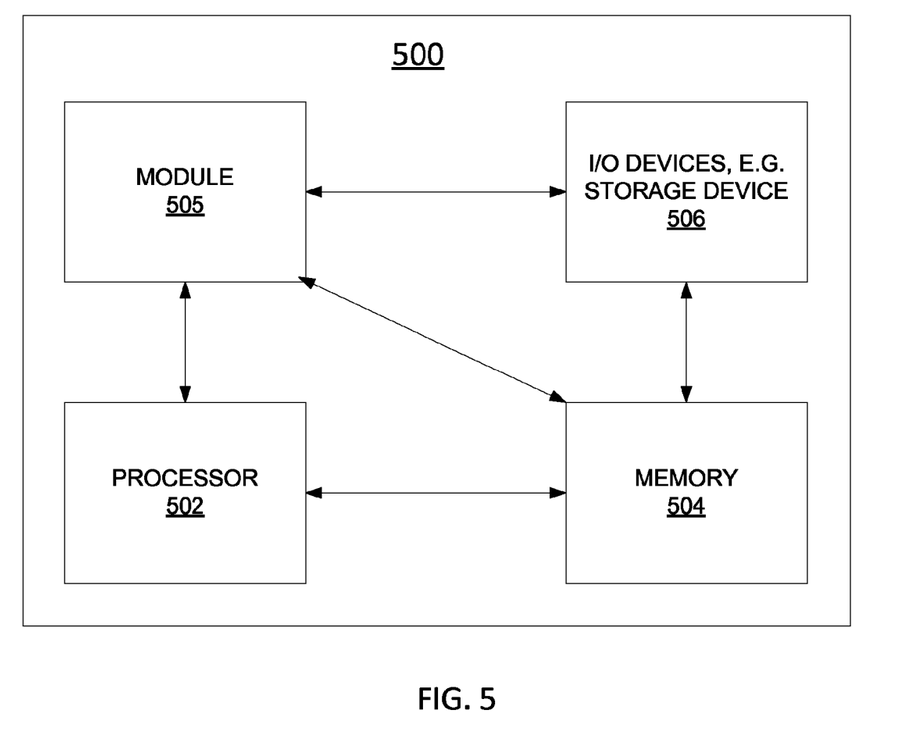
FIG. 5 depicts a high-level block diagram of a general-purpose computer suitable for use in performing the functions described herein.

FIG. 5 depicts a high-level block diagram of a general-purpose computer or a hardware device suitable for use in performing the functions described herein. As depicted in FIG. 5, the system 500 comprises a hardware processor element 502 (e.g., a CPU), a memory 504, e.g., random access memory (RAM) and/or read only memory (ROM), a module 505 for providing a differential transmission line driver, and various input/output devices 506 (e.g., storage devices, including but not limited to, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

It should be noted that the teachings of the present disclosure can be implemented in software and hardware, e.g., using application specific integrated circuits (ASIC), a general purpose computer or any other hardware equivalents, e.g., computer readable instructions pertaining to the method(s) discussed above can be used to configure a hardware processor to perform operations of the above disclosed methods. For example, a computer-readable medium may be in communication with the processor, where the computer-readable medium storing a plurality of instructions which, when executed by the hardware processor, cause the hardware processor to perform the operations (e.g., method 400) as disclosed above.

In one embodiment, the present module or process 505 for providing a differential transmission line driver can be loaded into memory 504 and executed by processor 502 to implement the functions as discussed above. As such, the present method 505 for providing a differential transmission line driver (including associated data structures) of the present disclosure can be stored on a tangible (physical) computer readable medium, e.g., RAM memory, magnetic or optical drive or diskette and the like.

Examples of the present disclosure may also be implemented in whole or in part by a tunable IC, e.g., a programmable logic device (PLD) and/or Field Programmable Gate Array (FPGA). More specifically, a programmable logic device is a general-purpose device that can be programmed by a user to implement a variety of selected functions. One type of PLD is a Field Programmable Gate Array, which typically includes an array of configurable logic blocks (CLBs) and a plurality of input/output blocks (IOBs). The CLBs are individually programmable and can be configured to perform a variety of logic functions on a few input signals. The IOBs can be configured to drive output signals from the CLBs to external pins of the FPGA and/or to receive input signals from the external FPGA pins. The FPGA also includes a programmable interconnect structure that can be programmed to selectively route signals among the various CLBs and IOBs to produce more complex functions of many input signals. The CLBs, IOBs, and the programmable interconnect structure are programmed by loading configuration data into associated memory cells that control various switches and multiplexers within the CLBs, IOBs, and the interconnect structure to implement logic and routing functions specified by the configuration data to implement a user design in the FPGA. An FPGA may also include other programmable and non-programmable resources. As such, the circuits or portions of the circuits shown above in connection with FIGS. 1-3 may be implemented in a plurality of CLBs that perform equivalent logic operations of any one or more components of any one or more of the circuits or portions of the circuits of FIGS. 1-3. Thus, in one example the system 500 can be configured to generate the necessary configuration data/instructions to configure an FPGA to perform the various functions as disclosed above.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A differential transmission line driver, comprising:
    a current mode logic (CML) stage; and
    a cross-coupled n-channel enhancement type metal-oxide semiconductor field-effect transistor (NMOS) stage, wherein the cross-coupled NMOS stage provides a feedback current to the CML stage, where each output voltage of the CML stage is characterized by symmetrical rising and falling edges when the feedback current flows, wherein
    the cross-coupled NMOS stage comprises:
        a first NMOS transistor of the cross-coupled NMOS stage, a second NMOS transistor of the cross-coupled NMOS stage, and a third NMOS transistor of the cross-coupled NMOS stage, wherein a gate terminal of the first NMOS transistor of the cross-coupled NMOS stage is connected to a drain terminal of the second NMOS transistor of the cross-coupled NMOS stage, wherein a gate terminal of the second NMOS transistor of the cross-coupled NMOS stage is connected to a drain terminal of the first NMOS transistor of the cross-coupled NMOS stage, wherein a source terminal of the first NMOS transistor of the cross-coupled NMOS stage is connected to a drain terminal of the third NMOS transistor of the cross-coupled NMOS stage, wherein a source terminal of the second NMOS transistor of the cross-coupled NMOS stage is connected to the drain terminal of the third NMOS transistor of the cross-coupled NMOS stage;
    the CML stage comprises:
        a first load resistor, a second load resistor, a first NMOS transistor of the CML stage, a second NMOS transistor of the CML stage, a third NMOS transistor of the CML stage, wherein a first end of the first load resistor is connected to a supply voltage, wherein a second end of the first load resistor is connected to a drain terminal of the first NMOS transistor of the CML stage, wherein a source terminal of the first NMOS transistor of the CML stage is connected to a drain terminal of the third NMOS transistor of the CML stage, wherein a gate terminal of the first NMOS transistor of the CML stage is connected to a first input current, wherein a first end of the second load resistor is connected to the supply voltage, wherein a second end of the second load resistor is connected to a drain terminal of the second NMOS transistor of the CML stage, wherein a source terminal of the second NMOS transistor of the CML stage is connected to the drain terminal of the third NMOS transistor of the CML stage;
    the drain terminal of the first NMOS transistor of the CML stage is connected to the drain terminal of the first NMOS transistor of the cross-coupled NMOS stage;
    the drain terminal of the second NMOS transistor of the CML stage is connected to the drain terminal of the second NMOS transistor of the cross-coupled NMOS stage;
    the source terminal of the first NMOS transistor of the CML stage and the source terminal of the second NMOS transistor of the CML stage are connected to a pass gate;
    the source terminal of the first NMOS transistor of the cross-coupled NMOS stage and the source terminal of the second NMOS transistor of the cross-coupled NMOS stage are connected to the pass gate; and
    wherein the pass gate selectively allows a DC bias to be partitioned to provide either a common bias or independent biases to the CML stage and the cross-coupled NMOS stage.

2. The differential transmission line driver of claim 1, wherein the first load resistor and the second load resistor are of equal value.

3. The differential transmission line driver of claim 1, wherein each of the first load resistor and the second load resistor is equal to 50Ω.

4. The differential transmission line driver of claim 1, wherein the first NMOS transistor of the CML stage and the second NMOS transistor of the CML stage have a same characteristic.

5. The differential transmission line driver of claim 1, wherein the first NMOS transistor of the cross-coupled NMOS stage and the second NMOS transistor of the cross-coupled NMOS stage have a same characteristic.

6. The differential transmission line driver of claim 1, wherein the first NMOS transistor of the CML stage, the second NMOS transistor of the CML stage, the first NMOS transistor of the cross-coupled NMOS stage, and the second NMOS transistor of the cross-coupled NMOS stage have a same characteristic.

7. The differential transmission line driver of claim 1, wherein a ratio of a current flowing through the CML stage and a current flowing through the cross-coupled NMOS stage is controlled via the DC bias.

8. The differential transmission line driver of claim 1,
    wherein a gate terminal of the third NMOS transistor of the cross-coupled NMOS stage is connected to the DC bias, wherein a source terminal of the third NMOS transistor of the cross-coupled NMOS stage is connected to a bias current source; and
    wherein a gate terminal of the third NMOS transistor of the CML stage is connected to the DC bias, wherein a source terminal of the third NMOS transistor of the CML stage is connected to the bias current source, wherein the bias current source is connected to a ground terminal.

9. A method of providing a differential transmission line driver, comprising:
    providing a feedback current to a current mode logic of the differential transmission line drive via a cross-coupled n-channel enhancement type metal-oxide semiconductor field-effect transistor (NMOS) stage, wherein the feedback current is provided by:
connecting a drain terminal of a first NMOS transistor of the cross-coupled NMOS stage to a first output terminal of the current mode logic of the differential transmission line driver; and
connecting a drain terminal of a second NMOS transistor of the cross-coupled NMOS stage to a second output terminal of the current mode logic of the differential transmission line driver,
wherein the current mode logic of the differential transmission line driver comprises:
a first NMOS transistor of the current mode logic of the differential transmission line driver having a drain terminal that is connected to the first output terminal of the current mode logic of the differential transmission line driver; and
a second NMOS transistor of the current mode logic of the differential transmission line driver having a drain terminal that is connected to the second output terminal of the current mode logic of the differential transmission line driver;
providing a pass gate coupled to a source terminal of the first NMOS transistor of the cross-coupled NMOS stage, to a source terminal of the second NMOS transistor of the cross-coupled NMOS stage, to a source terminal of the first NMOS transistor of the current mode logic of the differential transmission line driver, and to a source terminal of the second NMOS transistor of the current mode logic of the differential transmission line driver; and
selectively controlling a DC bias using the pass gate to provide either a common bias or independent biases to the current mode logic and the cross-coupled NMOS stage;
wherein a first input current and a second input current are provided to the current mode logic of the differential transmission line driver,
wherein the first input current and the second input current have equal values, and the first input current and the second input current are one hundred eighty degrees out of phase; and
providing output voltages over outputs of the current mode logic, wherein each of the output voltages is characterized by symmetrical rising and falling edges when the feedback current flows.

* * * * *